(12) United States Patent
Do et al.

(10) Patent No.: US 7,960,841 B2
(45) Date of Patent: Jun. 14, 2011

(54) THROUGH-HOLE VIA ON SAW STREETS

(75) Inventors: Byung Tai Do, Singapore (SG); Heap Hoe Kuan, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 33 days.

(21) Appl. No.: 12/496,046

(22) Filed: Jul. 1, 2009

(65) Prior Publication Data

US 2009/0267236 A1    Oct. 29, 2009

Related U.S. Application Data

(62) Division of application No. 11/744,657, filed on May 4, 2007, now Pat. No. 7,569,421.

(51) Int. Cl.
*H01L 23/48* (2006.01)
(52) U.S. Cl. .................. 257/774; 257/686; 257/E23.011
(58) Field of Classification Search .................. 257/686, 257/723, 777, 774, E23.011
See application file for complete search history.

(56) References Cited

U.S. PATENT DOCUMENTS

| | | | |
|---|---|---|---|
| 6,420,244 B2 | 7/2002 | Lee | |
| 6,790,710 B2 * | 9/2004 | McLellan et al. | 438/122 |
| 6,852,607 B2 | 2/2005 | Song et al. | |
| 7,791,206 B2 * | 9/2010 | Takeuchi et al. | 257/774 |
| 2005/0046002 A1 | 3/2005 | Lee et al. | |

* cited by examiner

*Primary Examiner* — Roy K Potter
(74) *Attorney, Agent, or Firm* — Robert D. Atkins; Patent Law Group

(57) ABSTRACT

A semiconductor device is manufactured by, first, providing a wafer designated with a saw street guide. The wafer is taped with a dicing tape. The wafer is singulated along the saw street guide into a plurality of dies having a plurality of gaps between each of the plurality of dies. The dicing tape is stretched to expand the plurality of gaps to a predetermined distance. An organic material is deposited into each of the plurality of gaps. A top surface of the organic material is substantially coplanar with a top surface of a first die of the plurality of dies. A plurality of via holes is formed in the organic material. Each of the plurality of via holes is patterned to each of a plurality of bond pad locations on the plurality of dies. A conductive material is deposited in each of the plurality of via holes.

30 Claims, 21 Drawing Sheets

US 7,960,841 B2

1

THROUGH-HOLE VIA ON SAW STREETS

CLAIM TO DOMESTIC PRIORITY

The present application is a division of, claims priority to, and fully incorporates herein by reference U.S. patent application Ser. No. 11/744,657, filed May 4, 2007.

FIELD OF THE INVENTION

The present invention relates in general to semiconductor devices and, more particularly, to a through-hole via stackable semiconductor device.

BACKGROUND OF THE INVENTION

In a growing trend, semiconductor manufacturers have increasingly adopted three-dimensional (3D) interconnects and packaging for semiconductor devices. Three-dimensional interconnects give advantages such as size reduction, reduced interconnect length and integration of devices with different functionality within a respective package.

One of the various ways of implementing 3D interconnects involves using so-called "through-hole via" technology. The location of a through-hole via can be located either within a semiconductor chip, or "die," or outside the die (i.e., along a so-called "saw street" guide).

However, current through-hole via technology poses several limitations. A via located within a semiconductor chip restricts the freedom of having additional circuitry within the chip. As can be appreciated, a respective location of a through-hole via forecloses the placement of circuitry at that location. As a result, the functionality of the chip, and therefore, a device making use of the chip, is limited.

A via located outside the semiconductor chip (i.e., along the saw street guide) necessitates a wider saw street to accommodate the creation of a through-hole. As a result, yields (i.e., chips per wafer) are reduced.

SUMMARY OF THE INVENTION

In light of the foregoing, the aim of the present invention is to provide a through-hole via stackable semiconductor device without having any of the accompanying limitations previously described.

Accordingly, in one embodiment, the present invention is a semiconductor device comprising a first semiconductor die and plurality of bond pads formed over a surface of the first semiconductor die. An organic material is disposed around a peripheral region of the first semiconductor die. A via is formed in the organic material. A conductive material is deposited in the via to form a conductive via. A metal trace connects the conductive via to one of the bond pads.

In another embodiment, the present invention is a semiconductor device comprising a first semiconductor die and bond pad formed over a surface of the first semiconductor die. An insulating material is disposed around a peripheral region of the first semiconductor die. A conductive via is formed in the insulating material. A metal trace connects the conductive via to the bond pad.

In still another embodiment, the present invention is a semiconductor device comprising a plurality of stacked semiconductor die. Each semiconductor die has a plurality of bond pads formed over a surface of the semiconductor die, an insulating material disposed around a peripheral region of the semiconductor die, a plurality of conductive vias formed in

2 the insulating material, and a metal trace connecting one of the conductive vias to a first one of the bond pads.

In still another embodiment, the present invention is a semiconductor device comprising a first semiconductor die and plurality of bond pads formed over a surface of the first semiconductor die. An insulating material is disposed around a peripheral region of the first semiconductor die. A plurality of conductive vias is formed in the insulating material. A metal trace connects one of the conductive vias to a first one of the bond pads. A second one of the bond pads is electrically isolated from the conductive vias.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
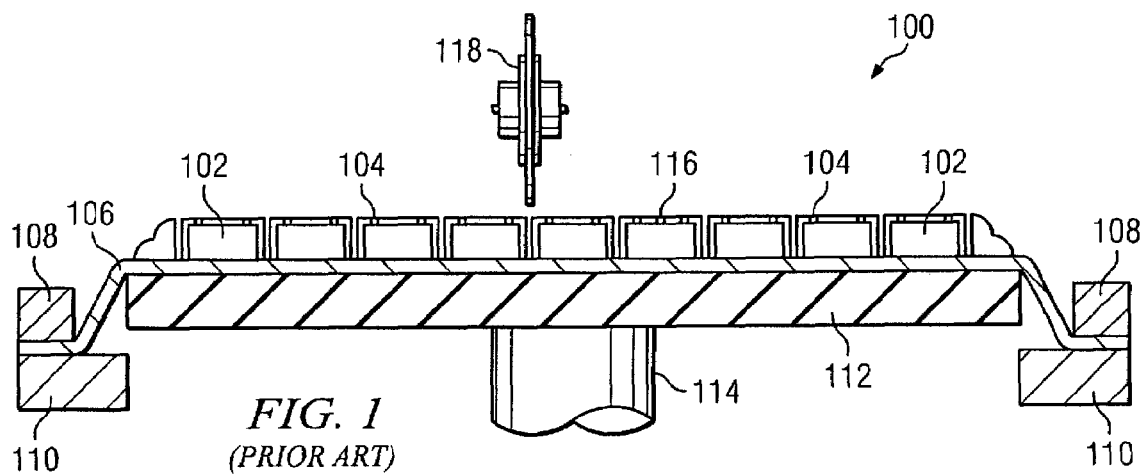
FIG. 1 illustrates an exemplary prior art method of making a wafer level chip scale package.

FIG. 1 illustrates an exemplary prior art method 100 of making a wafer level chip scale package. A plurality of chips 102 are cut from a wafer. Each chip 102 has a plurality of protruding bonding pads 104 located on the active surface of the chip 102.

The plurality of chips 102 are disposed on the top surface of a retractable film 106. The retractable film 106 is secured by a frame 108. The frame 108 is fixed by a fixture 110 and the retractable film 106 is displaced on a work platform 112 and stretched to a certain distance.

The platform 112 can move up relative to the fixture 110. The wafer is cut by a cutter into the plurality of chips 102 as shown which have been encapsulated into semiconductor packages and then sawn by a cutter 118. A shaft 114 moves upward to lift the platform 112 relative to the fixture 110.

The present invention improves upon the exemplary prior art method 100 of manufacture to render a through-hole via semiconductor device which is, in some embodiments, stacked together for specific applications and implementations.

Figure 2A:
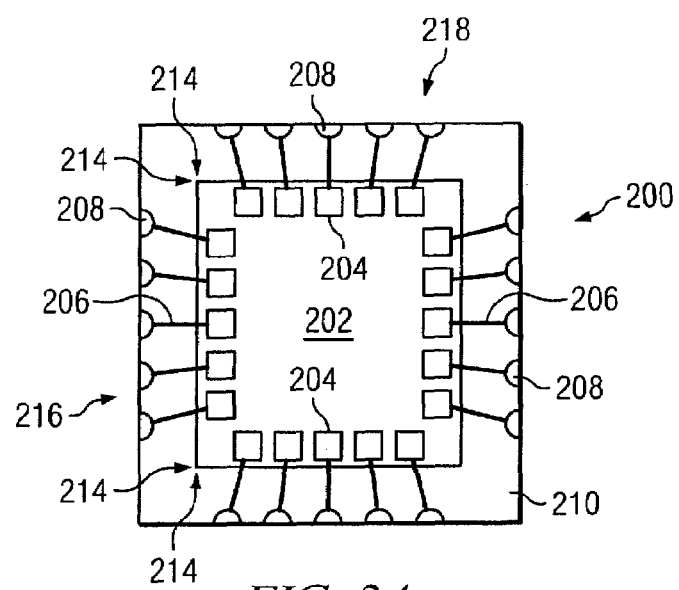
FIGS. 2A and 2B illustrate a first embodiment of a through-hole via stackable semiconductor device in a top and side view, respectively.
Figure 2B:
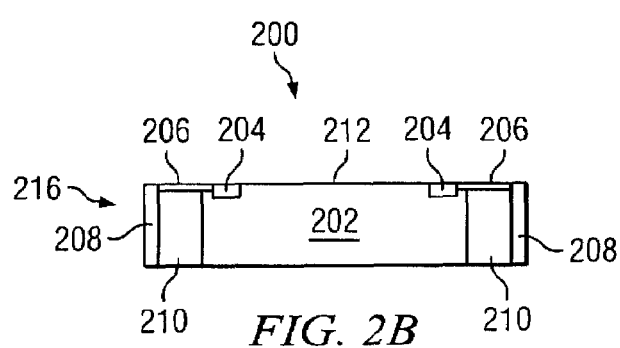

FIGS. 2A and 2B illustrate a first embodiment of a through-hole via stackable semiconductor device 200, in a top and side view, respectively. Device 200 has an incorporated die 202. The device 200 includes a plurality of bond pads 204 which are deposited on an active side of the semiconductor die 202. The bonding pads 204 can be deposited on the electrode terminals of the die 202 by a plating process, or otherwise. The materials of the bonding pads 204 can be made from conductive metal, such aluminum (Al). The bonding pads 204 can be joined to a substrate by a soldering process.

A series of metal traces 206 electrically couple the bond pads 204 to the via 208. As seen in FIG. 2B, the via 208 extends vertically from the active, top surface 212 of the die 202 and surrounding material 210 to a bottom surface of the die and surrounding material 210, which is consistent with a through-hole via design.

The surrounding material 210, which is, for purposes of the present invention, referred to as an "organic material" is deposited around a peripheral surface 214 of the die 202 as shown. The organic material 210 is an improvement and a departure from that of the prior art, as will be further described. The organic material can include such materials as benzocyclobutene (BCB), a polyimide (PI) material, or similar. As shown, the vias 208 are formed in the organic material 210 and organized according to rows. In the present embodiment 200, the vias 208 are formed in each side of the organic material 210 (e.g., sides 216, and 218) so as to completely surround the periphery of die 202. Each of the plurality of bond pads 204 is electrically coupled to each of the plurality of vias 208.

As will be seen, through-hole vias 208 can be formed in various configurations, for example, along multiple rows. Further, half-cut vias (as shown in the instant figure) or complete, uncut vias 208 can be formed in various embodiments to suit particular implementations. The semiconductor device 200 can be stacked or coupled with additional dies 202 in a variety of configurations.

Figure 3A:
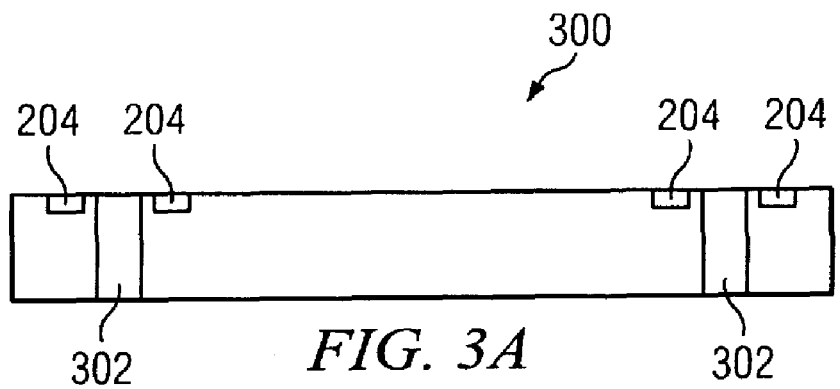
FIGS. 3A and 3B illustrate a first step in a first exemplary method of manufacturing the through-hole via stackable semiconductor device shown in FIGS. 2A and 2B as seen in a side and top view, respectively.
Figure 3B:
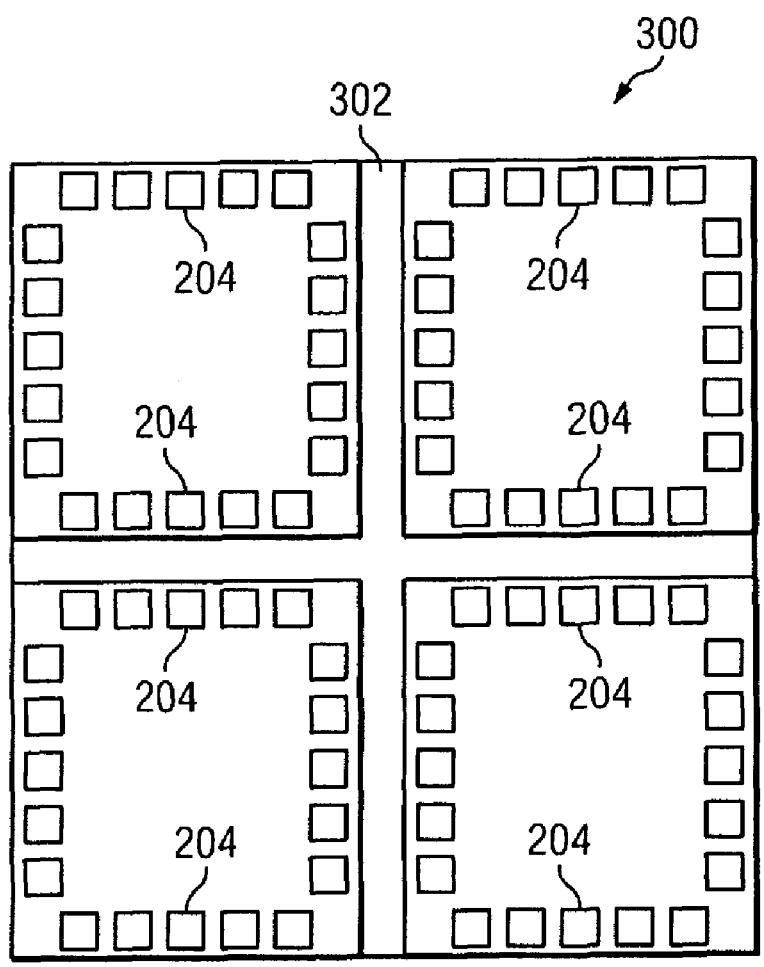

FIGS. 3A and 3B illustrate a first step in a first exemplary method of manufacturing the through-hole via stackable semiconductor device shown in FIGS. 2A and 2B as seen in a side and top view, respectively. A wafer 300 is provided. A series of bond pads 204 are formed on an active surface of the wafer as shown. The wafer is designated with a saw street guide 302.

Figure 4A:
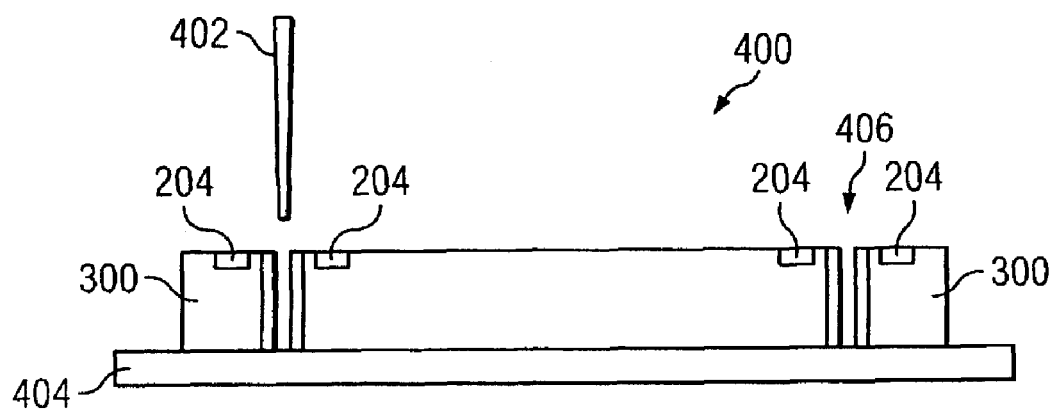
FIGS. 4A and 4B illustrate a second step in a first exemplary method of manufacturing the through-hole via stackable semiconductor device shown in FIGS. 2A and 2B as seen in a side and top view, respectively.
Figure 4B:
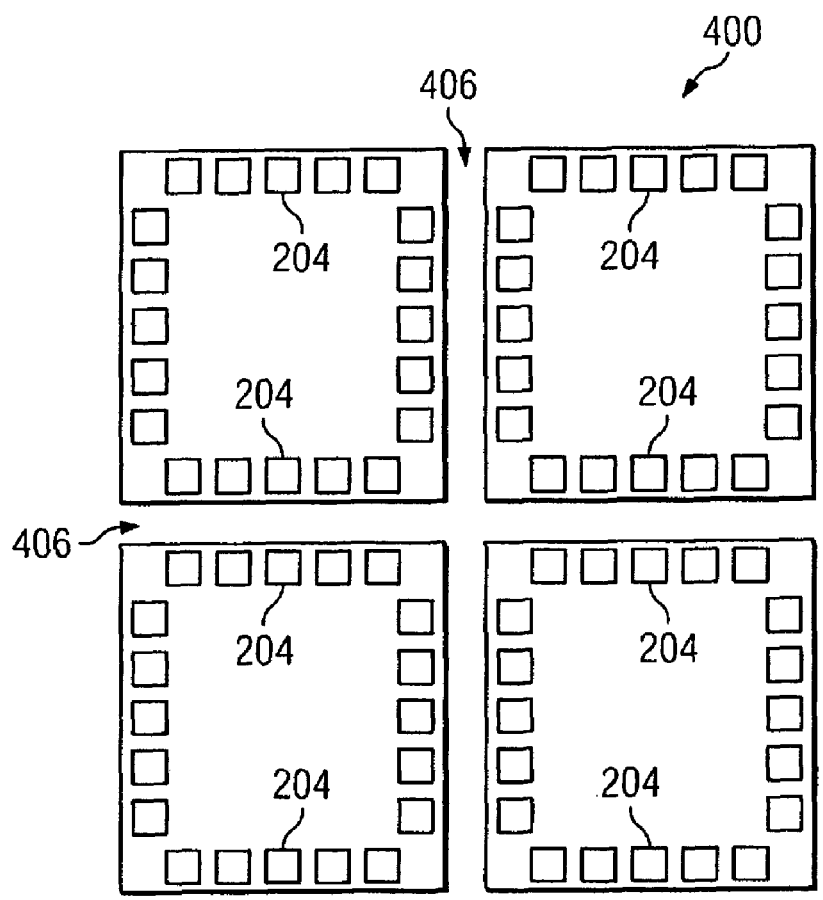

FIGS. 4A and 4B illustrate a second step in the first exemplary method of manufacturing the through-hole via stackable semiconductor device shown in FIGS. 2A and 2B as seen in a side and top view, respectively. The wafer 300 is singulated into the depicted pieces 400 for a first time by a cutting source 402. The cutting source 402 can include a saw or a laser cutting tool.

Prior to singulation, the wafer 300 is placed on a dicing tape 404, which keeps the various segments 400 in place during the singulation process. Subsequent to the singulation process, a series of gaps 406 is formed between respective segments 400 as shown.

Figure 5A:
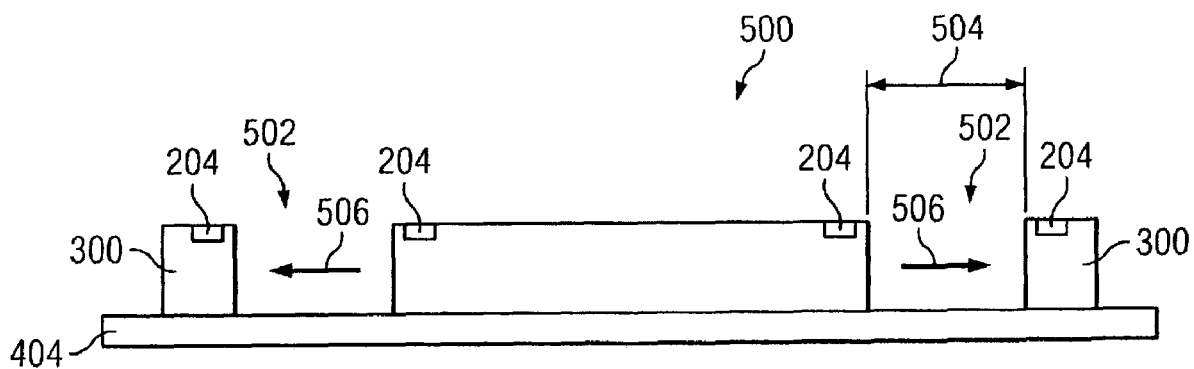
FIGS. 5A and 5B illustrate a third step in a first exemplary method of manufacturing the through-hole via stackable semiconductor device shown in FIGS. 2A and 2B as seen in a side and top view, respectively.
Figure 5B:
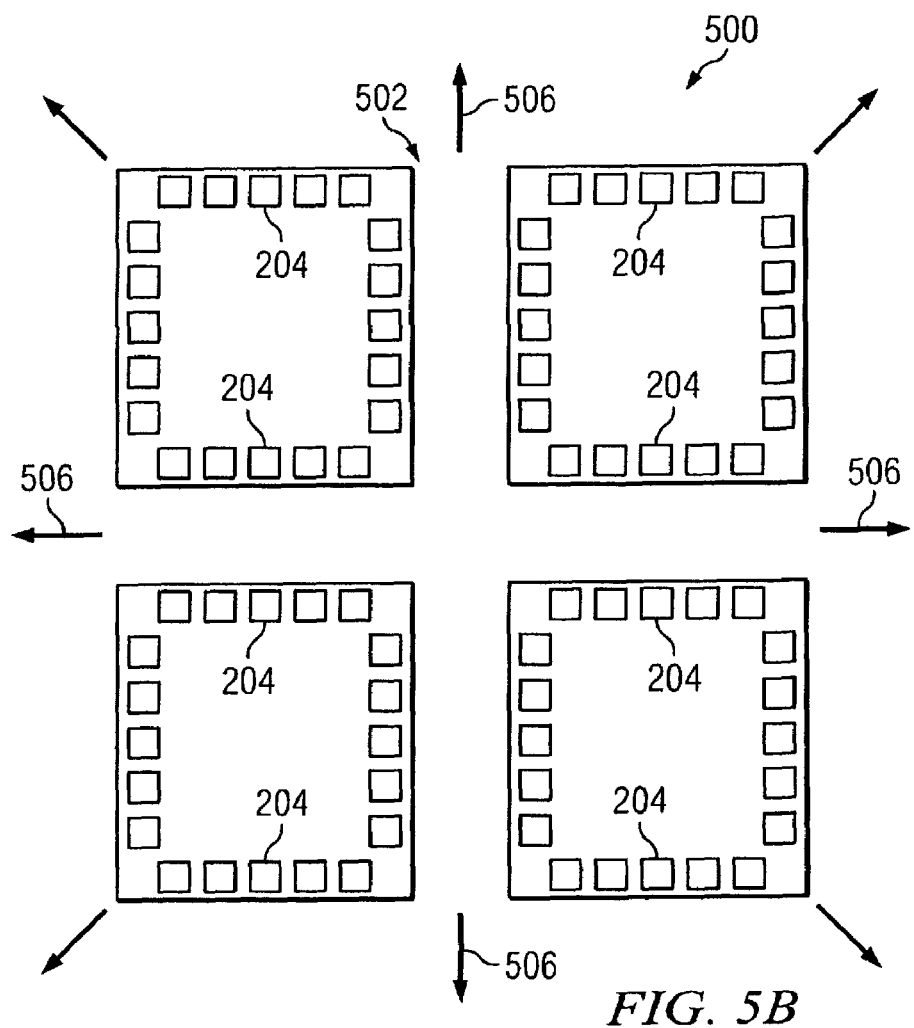

FIGS. 5A and 5B illustrate a third step in the first exemplary method of manufacturing the through-hole via stackable semiconductor device shown in FIGS. 2A and 2B as seen in a side and top view, respectively. Wafer 300, in the depicted respective segments, undergoes an expansion process. The dicing tape 404 can be stretched by various techniques (i.e., by using an expansion table), to render a series of gaps 502 having predetermined distances 504. The depicted arrows 506 indicate the various expansion directions undergone by the wafer expansion process.

Figure 6A:
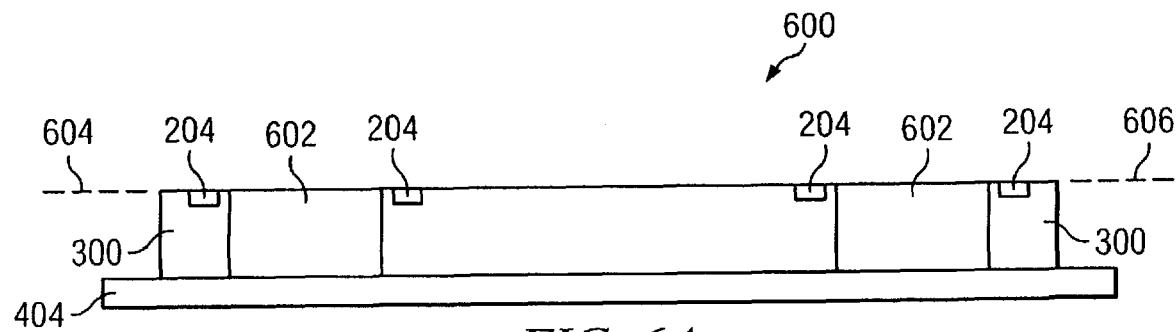
FIGS. 6A and 6B illustrate a fourth step in a first exemplary method of manufacturing the through-hole via stackable semiconductor device shown in FIGS. 2A and 2B as seen in a side and top view, respectively.
Figure 6B:
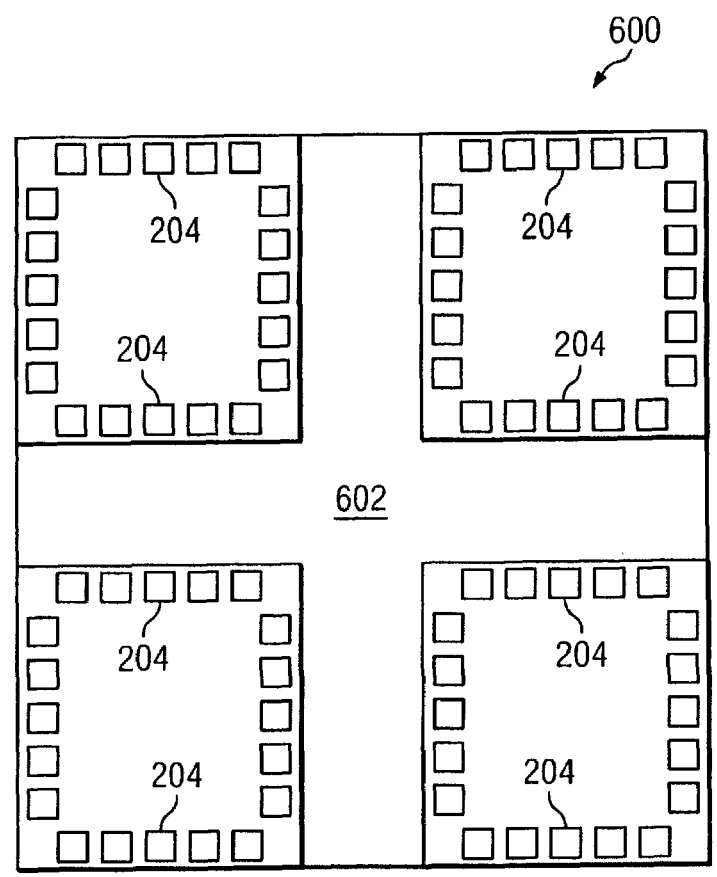

As a next step, FIGS. 6A and 6B illustrate a fourth step in the first exemplary method of manufacturing the through-hole via stackable semiconductor device shown in FIGS. 2A and 2B as seen in a side and top view, respectively. The various gaps 502 seen in FIGS. 5A and 5B are filled with the previously described organic material 602. A plane 604 corresponding to a top surface of the filled segments 600 is substantially coplanar with a plane 606 corresponding to a top surface of the organic material 602.

The organic material 602 application can be performed by such methods as spin-coating, needle dispensing, or a similar application.

Figure 7A:
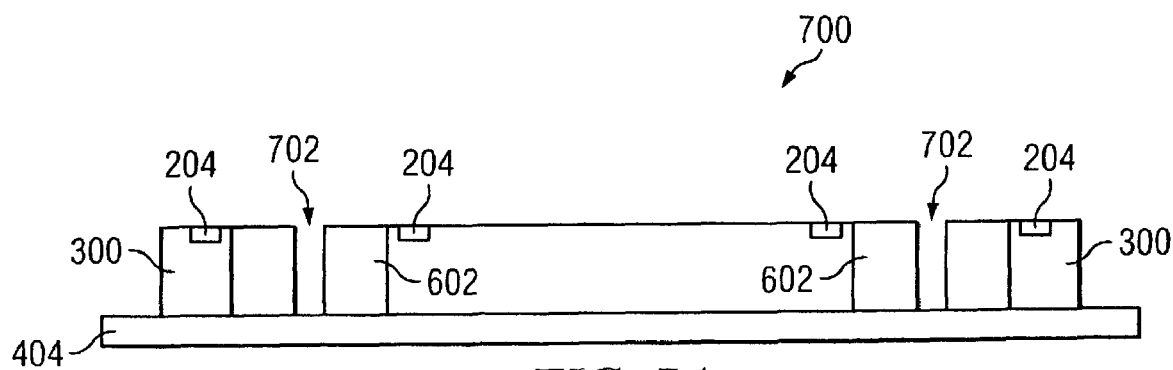
FIGS. 7A and 7B illustrate a fifth step in a first exemplary method of manufacturing the through-hole via stackable semiconductor device shown in FIGS. 2A and 2B as seen in a side and top view, respectively.
Figure 7B:
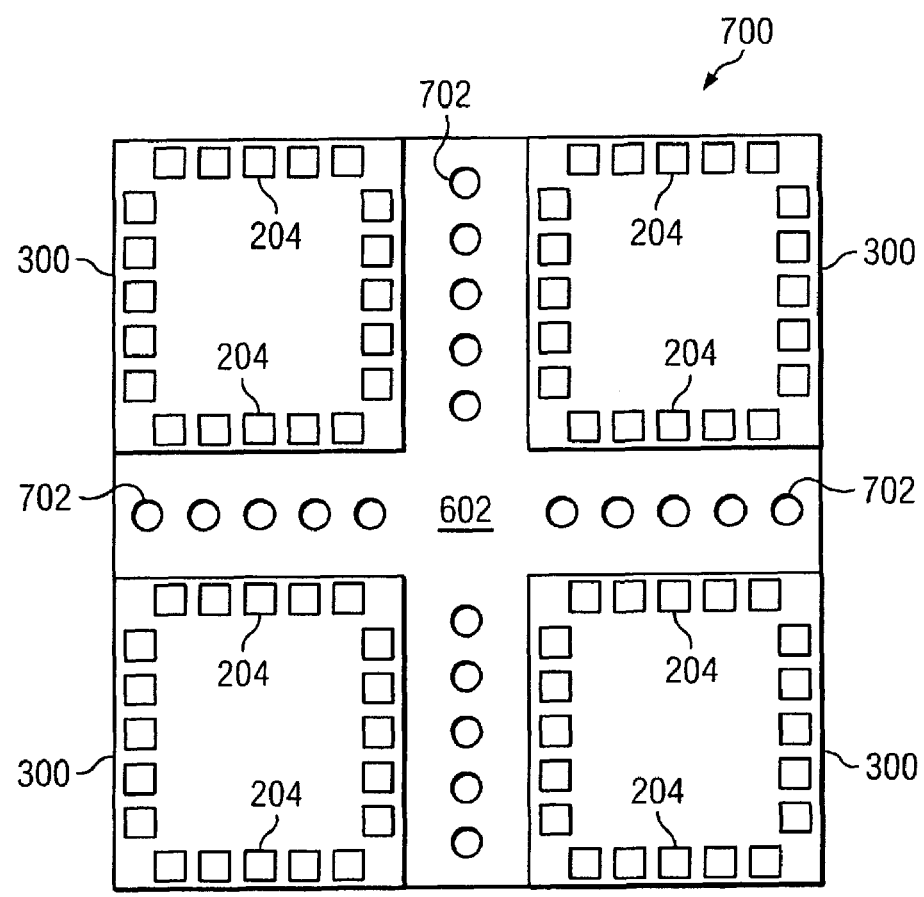

FIGS. 7A and 7B illustrate a fifth step in the first exemplary method of manufacturing the through-hole via stackable semiconductor device shown in FIGS. 2A and 2B as seen in a side and top view, respectively. Segments 700 undergo a process to form a plurality of via holes 702 in the organic material 602 as shown. The via holes can be formed in various processes, including a laser via drilling process or an etching process. As is seen, each of the via holes is configured in the organic material 602 to correspond to a respective bump pad 204 to which the via hole will be associated.

Figure 8A:
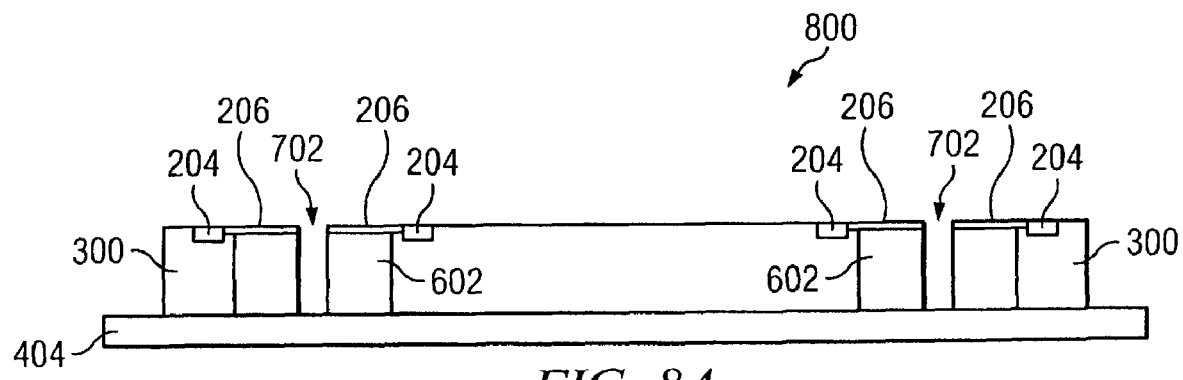
FIGS. 8A and 8B illustrate a sixth step in a first exemplary method of manufacturing the through-hole via stackable semiconductor device shown in FIGS. 2A and 2B as seen in a side and top view, respectively.
Figure 8B:
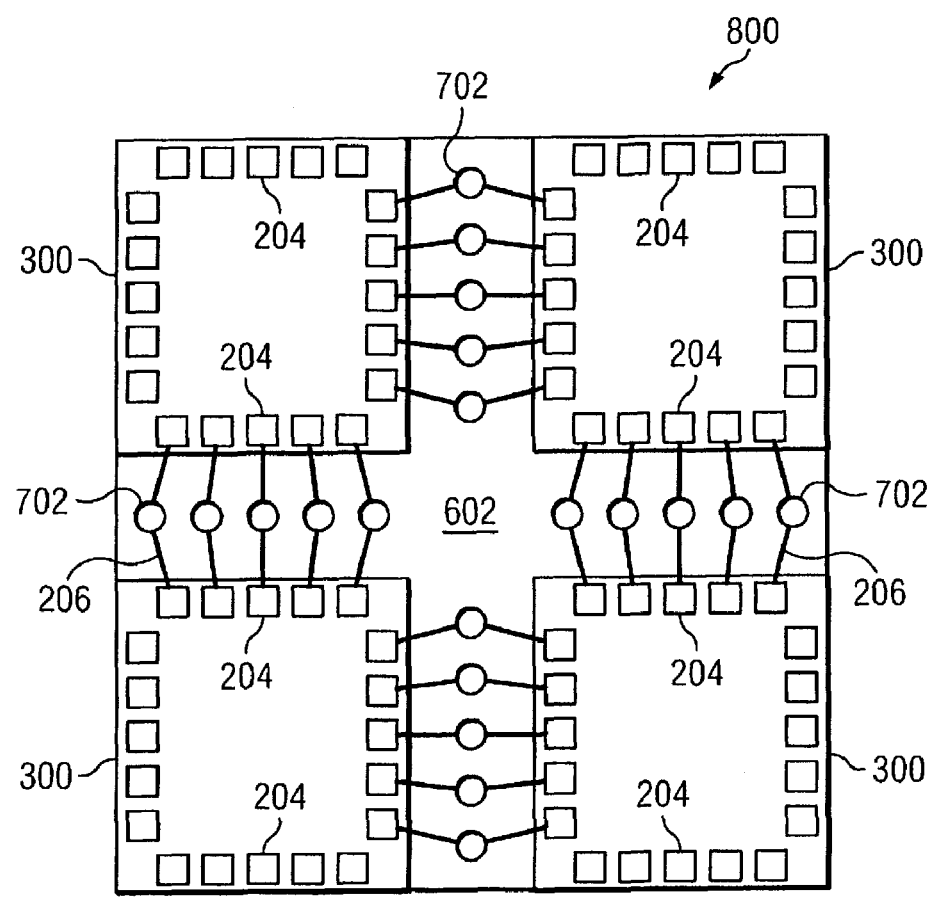

Turning to FIGS. 8A and 8B, a sixth step in the first exemplary method of manufacturing the through-hole via stackable semiconductor device shown in FIGS. 2A and 2B as seen in a side and top view, respectively, is shown. FIGS. 8A and 8B illustrate a metal patterning process which connects a series of metal traces 206 from the bond pads 204 to the via holes 702. Here again, the metal traces 206 electrically connect the bond pads to each of the via holes 702 locations as shown.

Figure 9A:
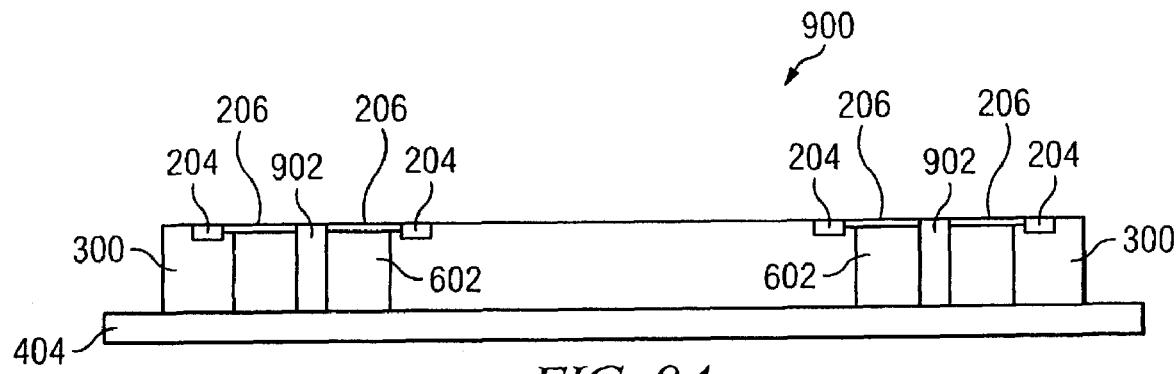
FIGS. 9A and 9B illustrate a seventh step in a first exemplary method of manufacturing the through-hole via stackable semiconductor device shown in FIGS. 2A and 2B as seen in a side and top view, respectively.
Figure 9B:
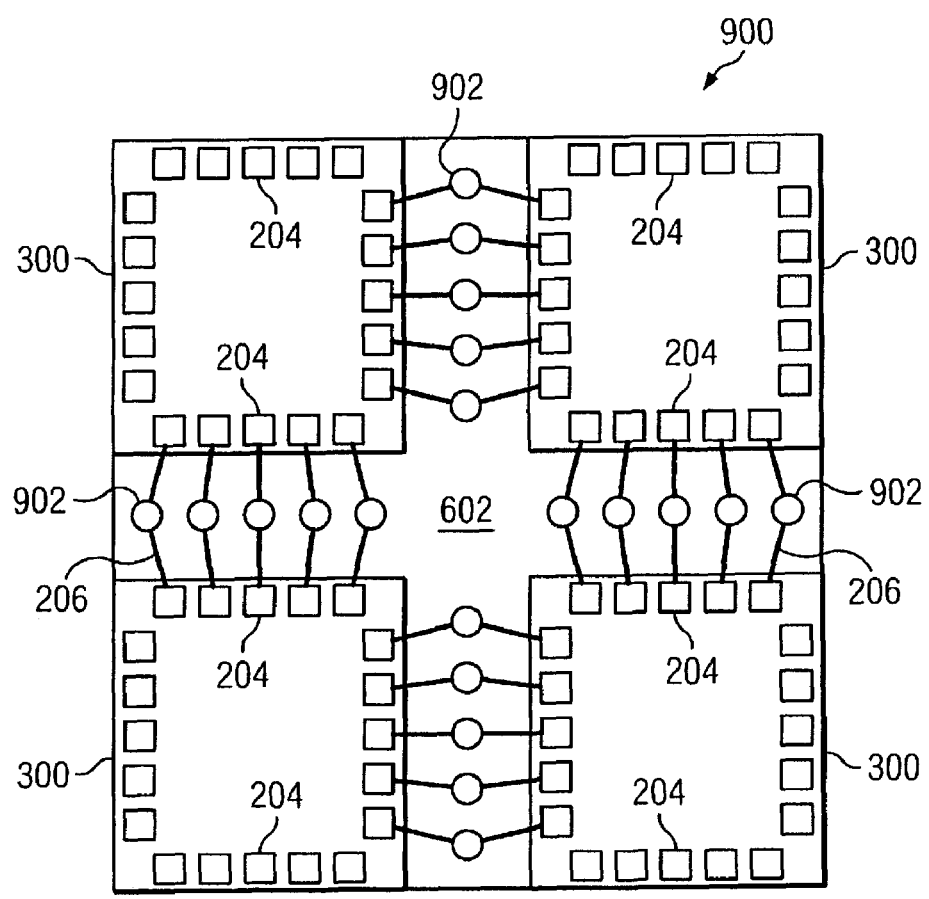

FIGS. 9A and 9B illustrate a seventh step in the first exemplary method of manufacturing the through-hole via stackable semiconductor device shown in FIGS. 2A and 2B. A via hole metal deposition process is performed to the assembly 900 to deposit conductive material into each of the via holes 702, forming a series of metal vias 902. The conductive material can materials such as aluminum (Al), copper (Cu), tungsten (W), or any other conductive metal, or any combination of metal alloy. Again, the metal vias 902 are formed in the organic material 602. A variety of methods and techniques can be used to form the metal vias, such as a plating or plugging process.

Figure 10A:
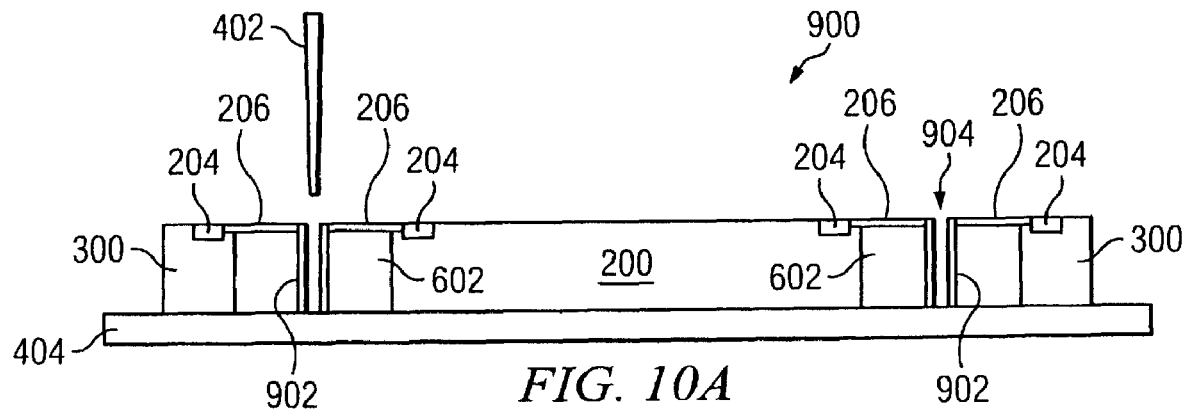
FIGS. 10A and 10B illustrate an eighth step in a first exemplary method of manufacturing the through-hole via stackable semiconductor device shown in FIGS. 2A and 2B as seen in a side and top view, respectively.
Figure 10B:
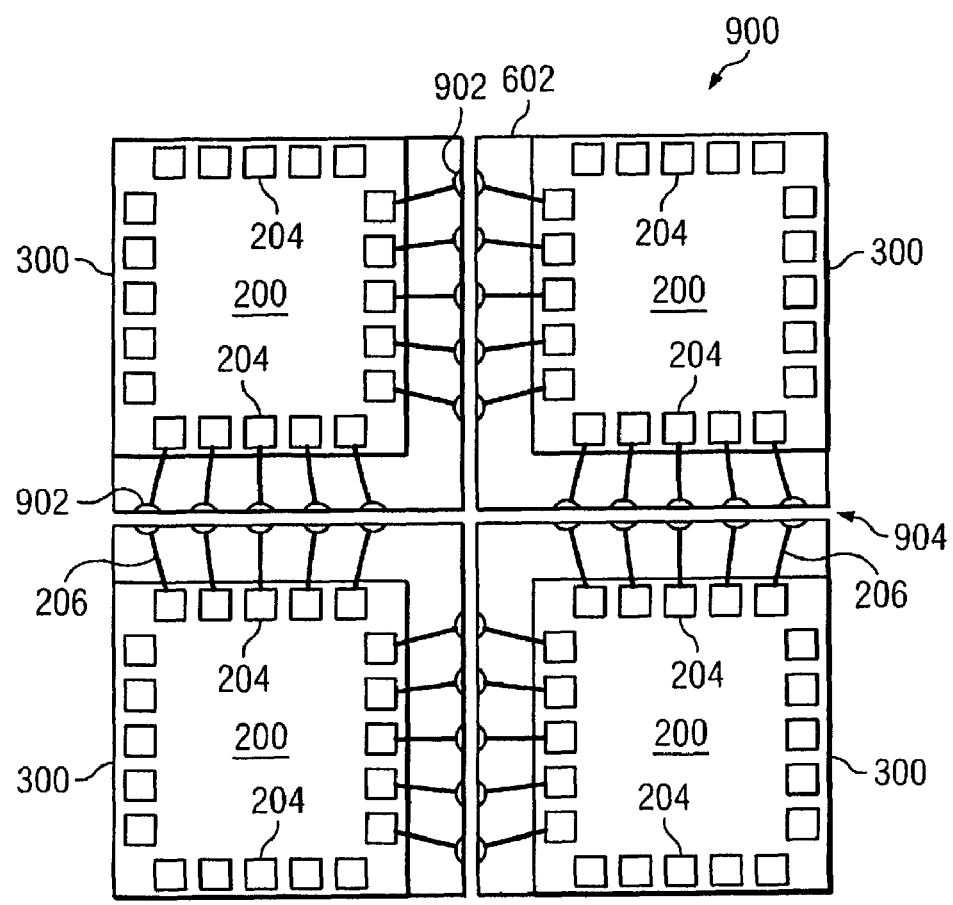

FIGS. 10A and 10B illustrate an eighth step in the first exemplary method of manufacturing the through-hole via stackable semiconductor device shown in FIGS. 2A and 2B. The wafer assembly 300, and 900 is singulated for a second time by a cutting source 402 to form gaps 904. As would be understood by one skilled in the art, the various dies 202 shown in FIGS. 10A, 10B, and the preceding exemplary figures represent a smaller portion of a totality of chips which are yielded from a particular wafer 300. As such, following the conclusion of the second singulation step, a majority of dies 202 are rendered to be like the embodiment shown in FIGS. 2A and 2B, where the organic material 210 completely surrounds the peripheral surface of the die 202, and the through-hole vias 902 are configured in rows along each side surface of the die as previously represented.

In one embodiment, following the singulation step depicted in FIGS. 10A and 10B, individual dies 202 are removed by a die pick and place process to remove each die 202 from the dicing tape 404.

Figure 11A:
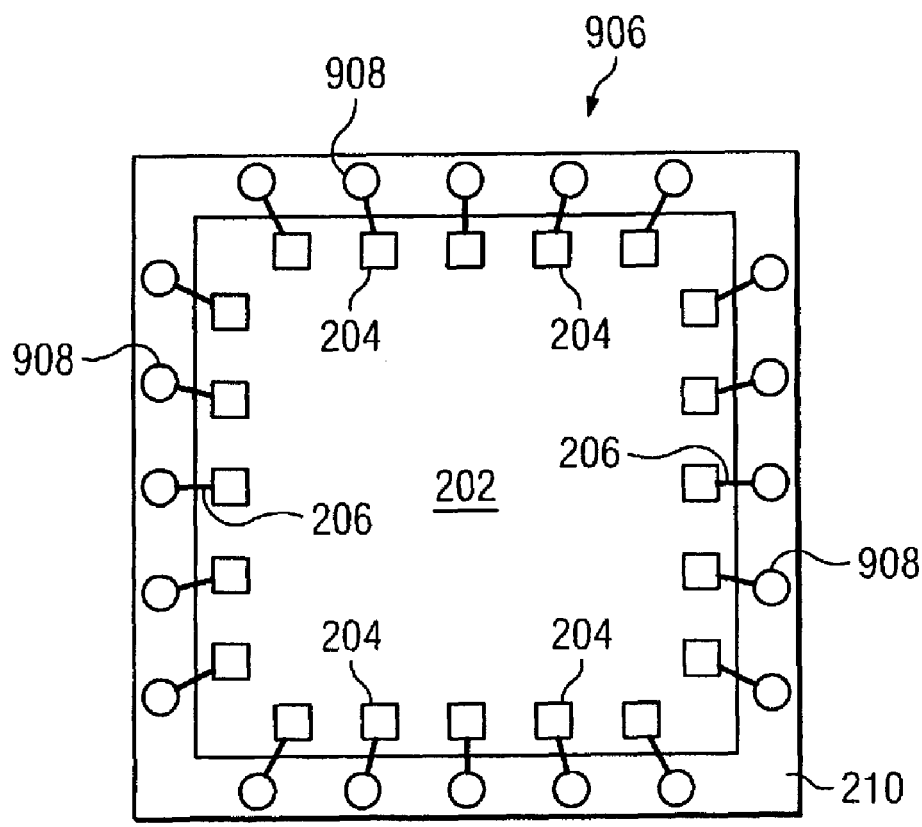
FIGS. 11A and 11B illustrate a second embodiment of a through-hole via stackable semiconductor device incorporating a plurality of complete through-hole vias, as seen in a top and side view, respectively.
Figure 11B:
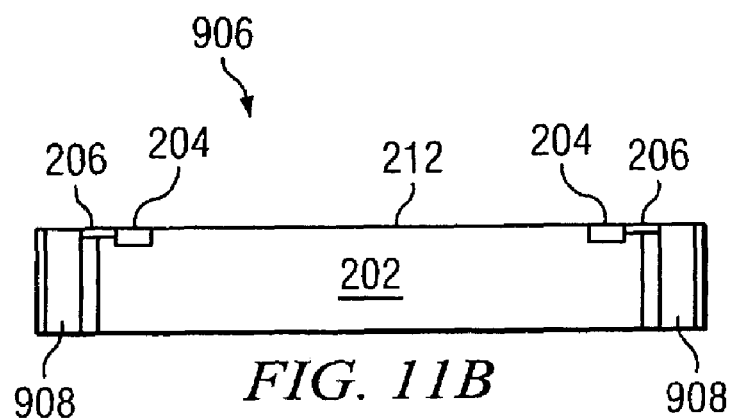

FIGS. 11A and 11B illustrate a second embodiment of a through-hole via stackable semiconductor device 906 incorporating a plurality of complete through-hole vias, as seen in a top and side view, respectively. Here again, the various features seen in the previous figures are shown, including a die 202, bond pads 204, and metal tracings which are formed on the active surface 212 of the die 202. In the instant embodiment 906, the respective through-hole vias 908 are "complete," in lieu of being half-cut as seen in the previous embodiment. The depicted complete through-hole vias 908 can be formed by a particular configuration of the saw street guide 302 as seen in FIGS. 3A and 3B. A wider saw street guide 302 allows the organic material 602 to be cut as shown, retaining a complete via hole 908.

Figure 12A:
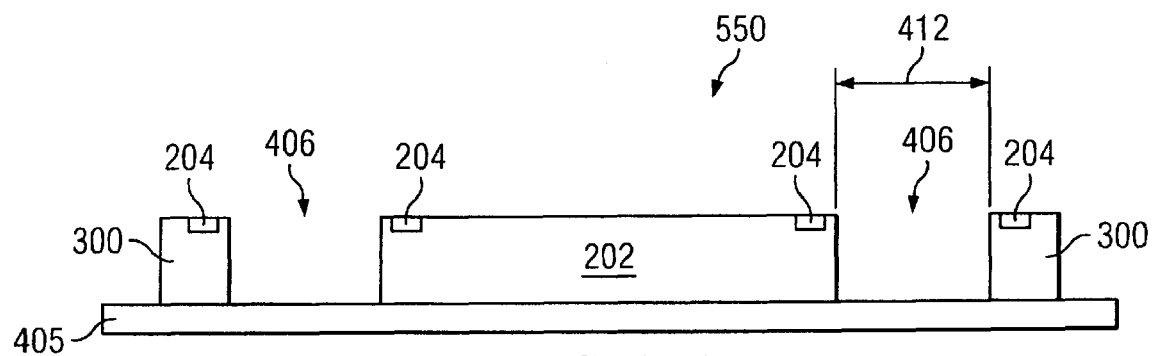
FIGS. 12A and 12B illustrate a third step in a second exemplary method of manufacturing the through-hole via stackable semiconductor device shown in FIGS. 2A and 2B as seen in a side and top view, respectively.
Figure 12B:
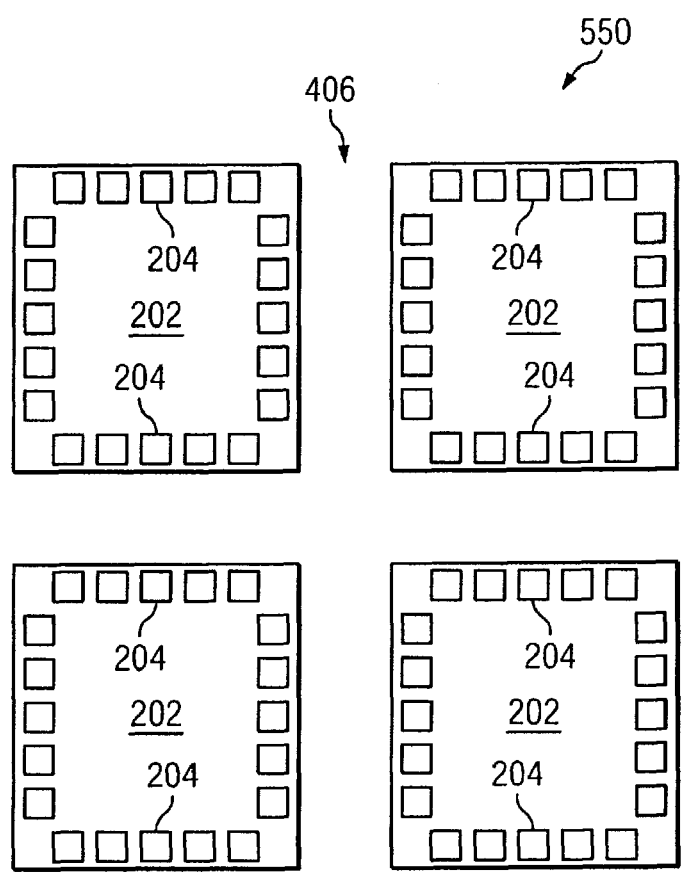

FIGS. 12A and 12B illustrate a third step in a second exemplary method of manufacturing the through-hole via stackable semiconductor device shown in FIGS. 2A and 2B as seen in a side and top view, respectively. The second method of manufacture as described shares the first two steps (i.e., providing a wafer and singulation into respective segments upon the dicing tape 404) as the first exemplary method previously described. In addition, various features (i.e., bond pads 204) are again seen.

As a next step, wafer 300 segments 550 are picked from the first dicing tape 404 and placed onto a so-called "wafer support system" 405 as seen. The wafer support system can logically include a second dicing tape 405. However, the wafer support system can also be a temporary wafer support system, such as glass, ceramic, laminate, or silicon (Si) substrate. In one embodiment, the sawn dies 202 are picked from the dicing tape 404 and placed onto the wafer support system 405 using pick and place machines. The pick and place process renders a gap 406 having a predetermined width or distance 412 between respective segments 550.

Figure 13A:
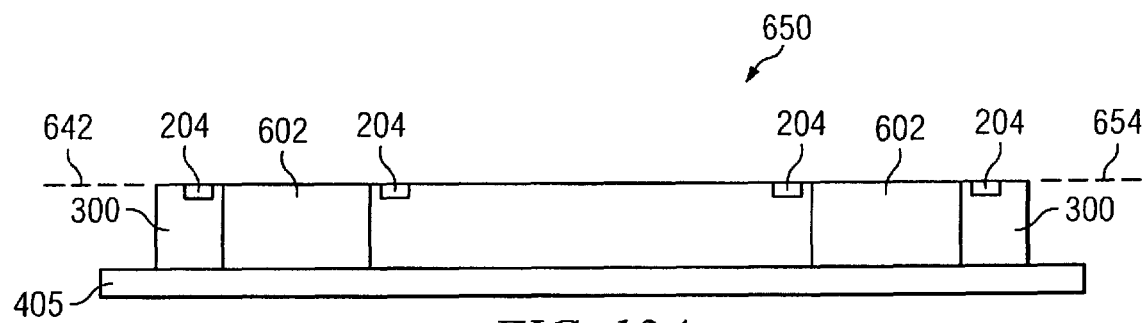
FIGS. 13A and 13B illustrate a fourth step in a second exemplary method of manufacturing the through-hole via stackable semiconductor device shown in FIGS. 2A and 2B as seen in a side and top view, respectively.
Figure 13B:
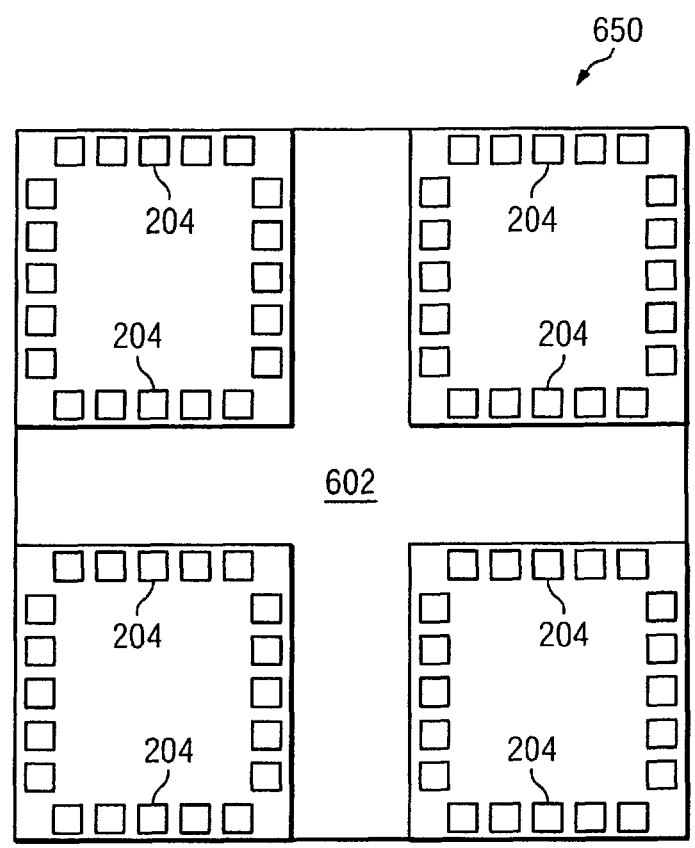

FIGS. 13A and 13B illustrate a fourth step in the second exemplary method of manufacturing the through-hole via stackable semiconductor device shown in FIGS. 2A and 2B. The organic material 602 is again applied to segments 650 in a similar spin-coating, needle dispensing, or other manner as previously described. Plane 642 of segments 650 is substantially coplanar with plane 654 of organic material 602.

Figure 14A:
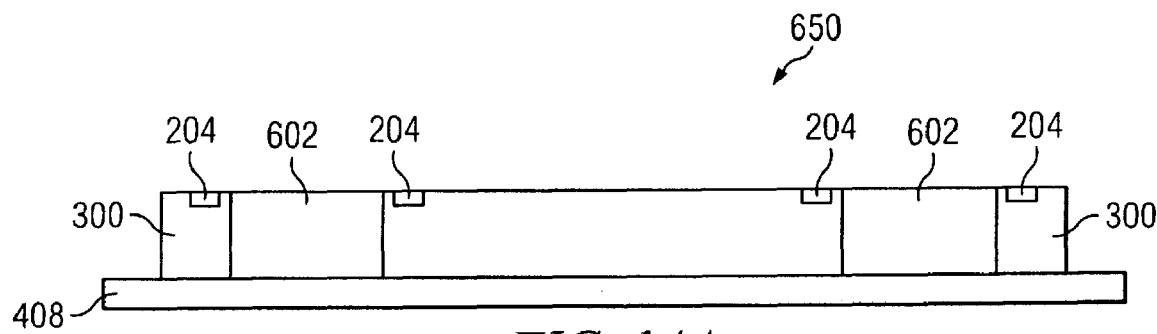
FIGS. 14A and 14B illustrate a fifth step in a second exemplary method of manufacturing the through-hole via stackable semiconductor device shown in FIGS. 2A and 2B as seen in a side and top view, respectively.
Figure 14B:
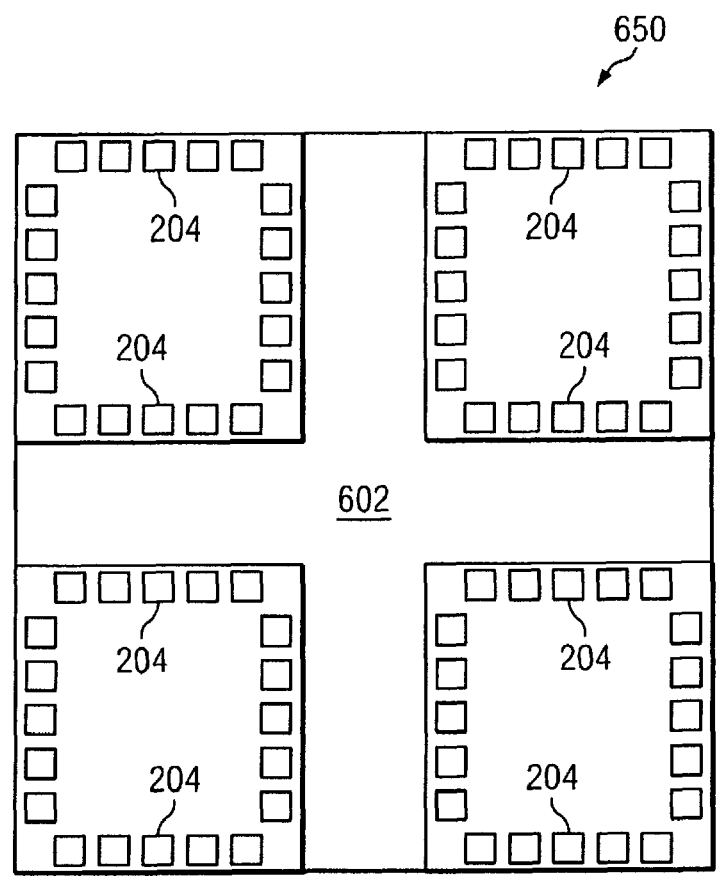

Turning to FIGS. 14A and 14B, a fifth step in the second exemplary method of manufacturing the through-hole via stackable semiconductor device shown in FIGS. 2A and 2B is shown. The recoated wafer 300 is transferred onto a second wafer support system 408. The second wafer support system can again include glass, silicon (Si) substrate materials, ceramic, and laminate materials.

Figure 15A:
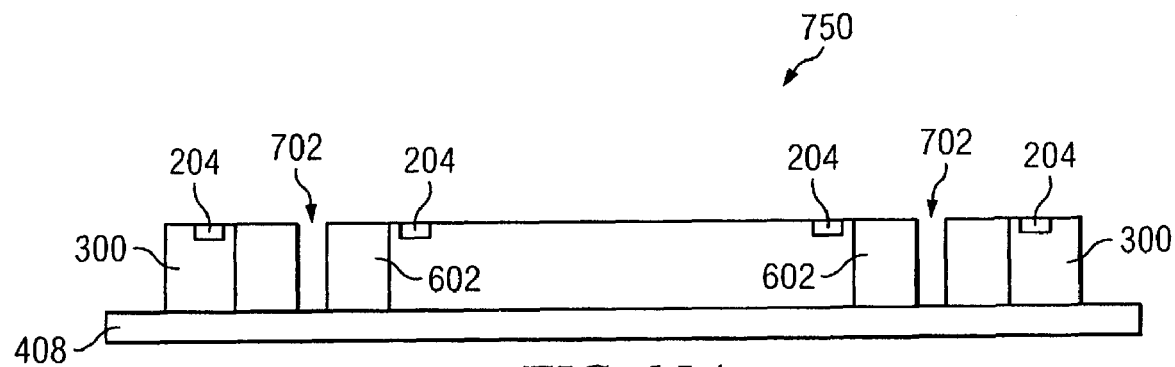
FIGS. 15A and 15B illustrate a sixth step in a second exemplary method of manufacturing the through-hole via stackable semiconductor device shown in FIGS. 2A and 2B as seen in a side and top view, respectively.
Figure 15B:
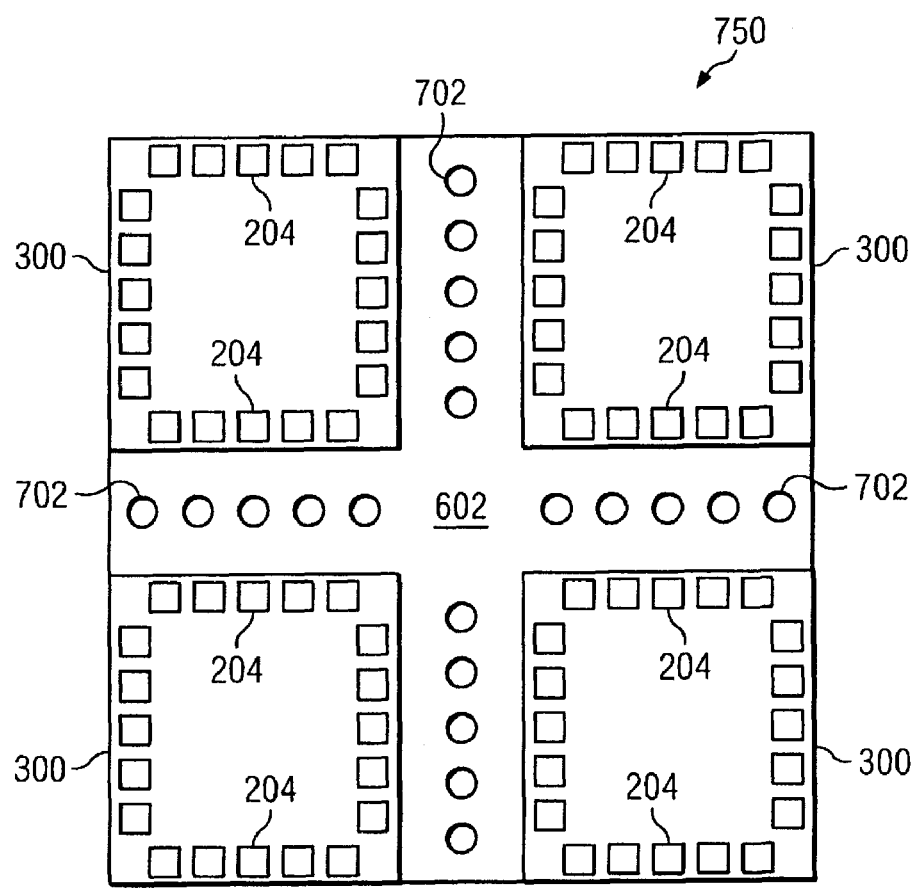

FIGS. 15A and 15B illustrate a sixth step in the second exemplary method of manufacturing the through-hole via stackable semiconductor device shown in FIGS. 2A and 2B as seen in a side and top view, respectively. In a step 750 similar to that shown in FIGS. 7A and 7B, a plurality of via holes 702, is formed in the organic material 602 to coincide with the bond pads 204.

Figure 16A:
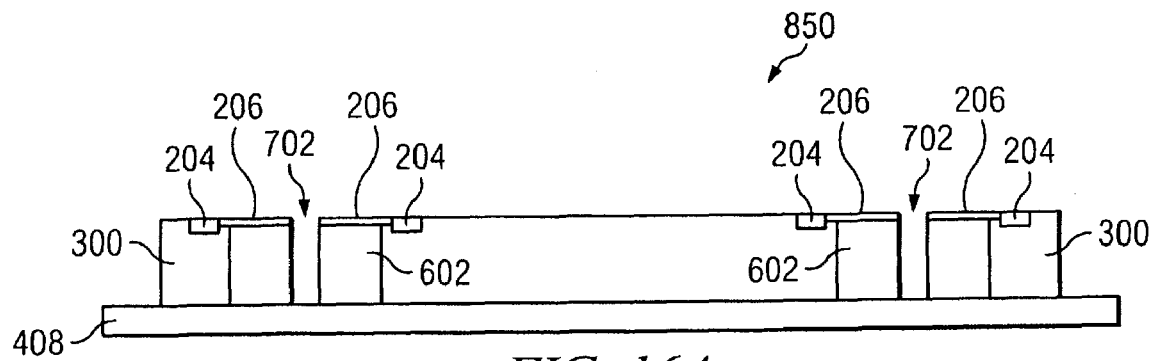
FIGS. 16A and 16B illustrate a seventh step in a second exemplary method of manufacturing the through-hole via stackable semiconductor device shown in FIGS. 2A and 2B as seen in a side and top view, respectively.
Figure 16B:
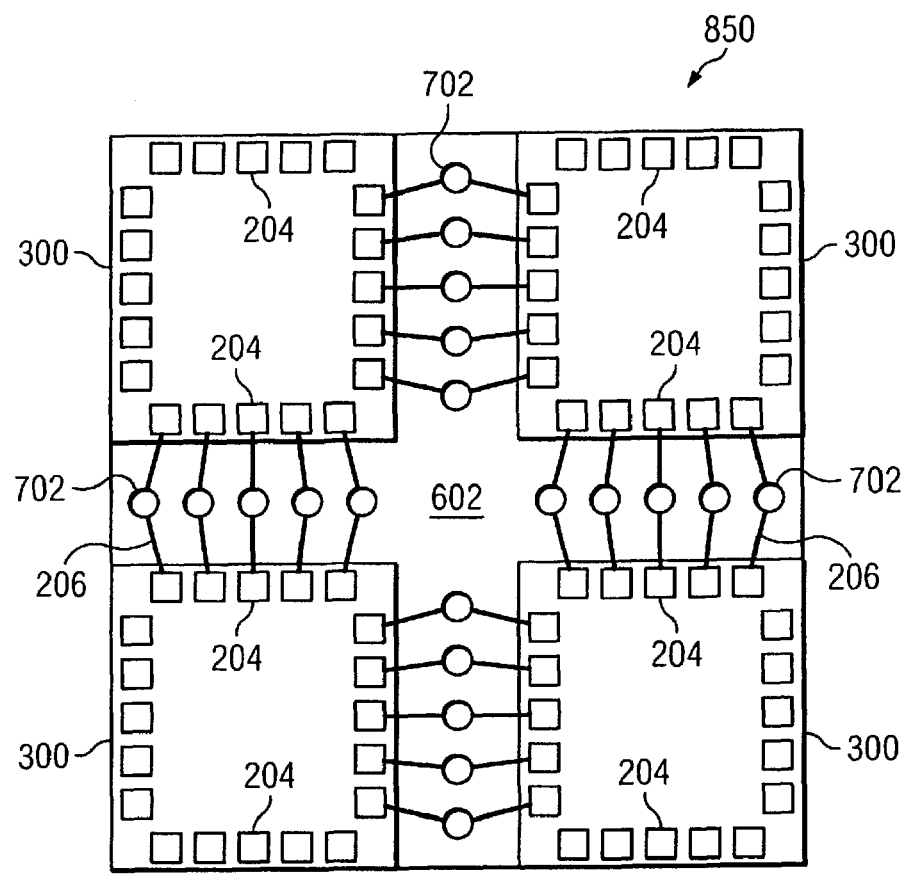

FIGS. 16A and 16B illustrate a seventh step 850 in the second exemplary method of manufacturing the through-hole via stackable semiconductor device shown in FIGS. 2A and 2B as seen in a side and top view, respectively. Step 850 is again similar to that shown in FIGS. 8A and 8B of metal patterning of metal traces 206 to electrically couple the bond pad 204 locations to the via 702 locations.

Figure 17A:
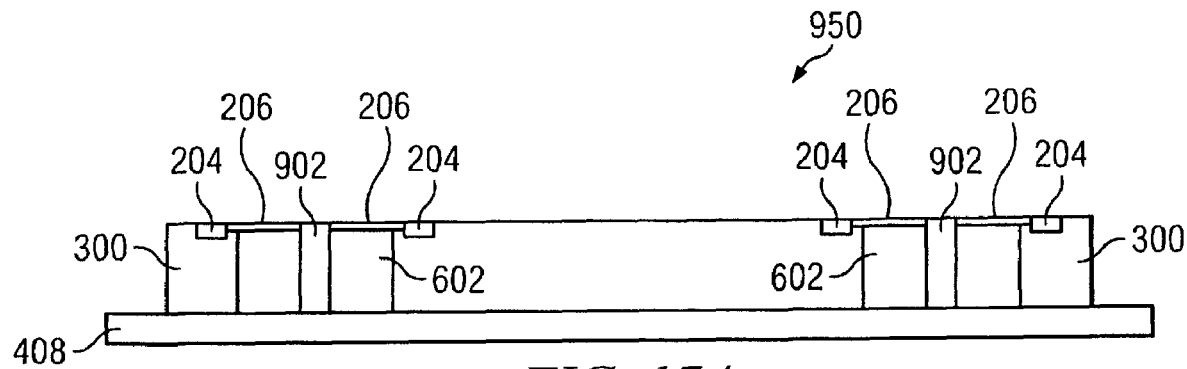
FIGS. 17A and 17B illustrate an eighth step in a second exemplary method of manufacturing the through-hole via stackable semiconductor device shown in FIGS. 2A and 2B as seen in a side and top view, respectively.
Figure 17B:
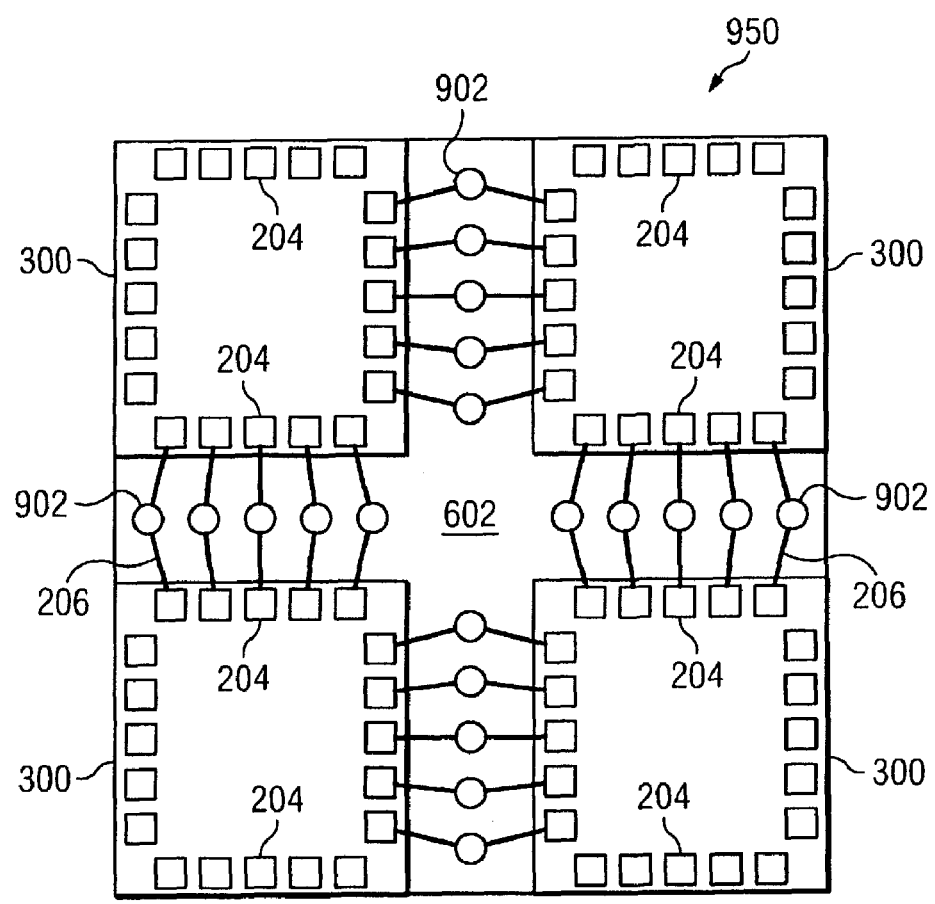

FIGS. 17A and 17B illustrate an eighth step 950 in the second exemplary method of manufacturing the through-hole via stackable semiconductor device shown in FIGS. 2A and 2B. The vias 702 are plugged, plated or otherwise deposited with a conductive material to fill the via holes 702 and render the metal vias 902 as shown.

Figure 18A:
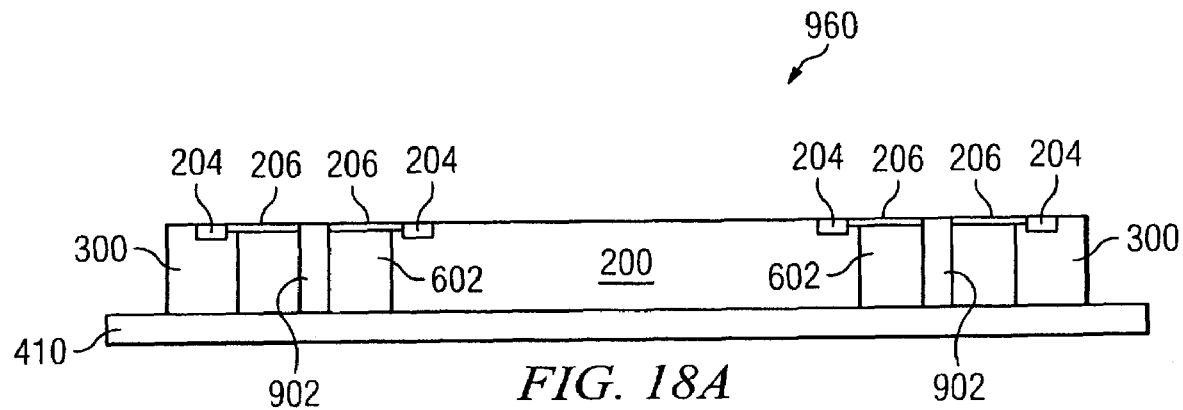
FIGS. 18A and 18B illustrate a ninth step in a second exemplary method of manufacturing the through-hole via stackable semiconductor device shown in FIGS. 2A and 2B as seen in a side and top view, respectively.
Figure 18B:
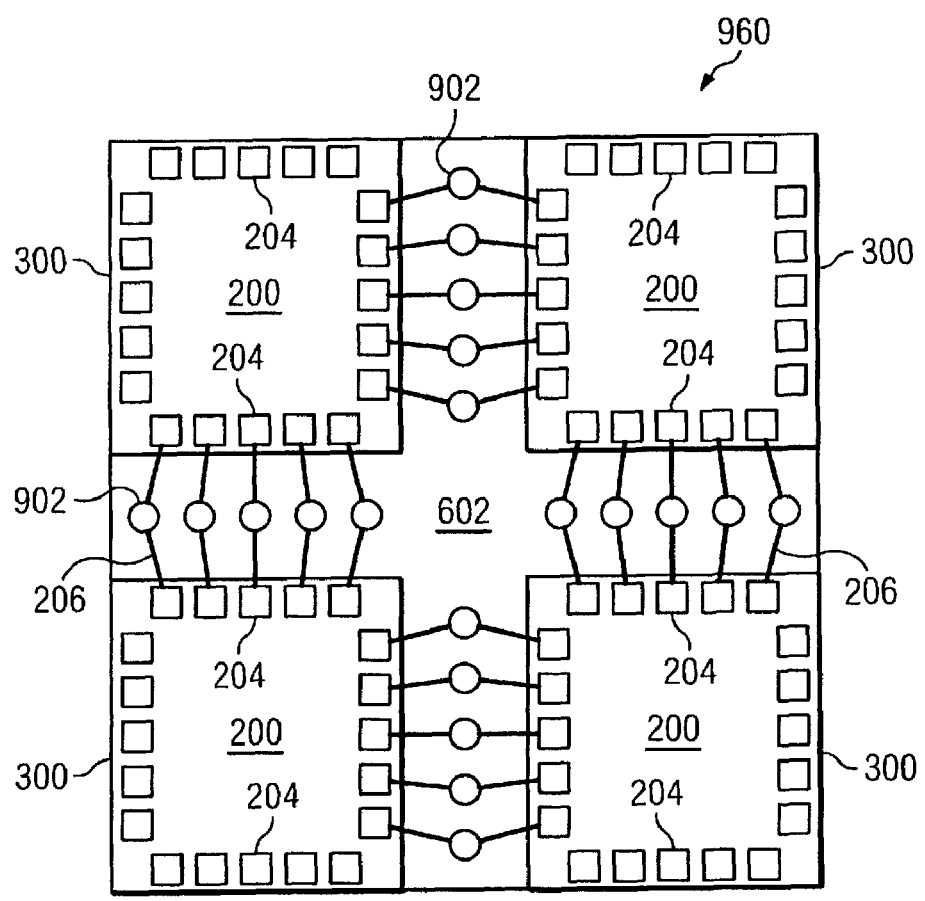

Following the metal via 902 formation process, the via hole wafer 960 is transferred onto an additional dicing tape 410 as shown in FIGS. 18A and 18B, which illustrates the depicted ninth step.

Figure 19A:
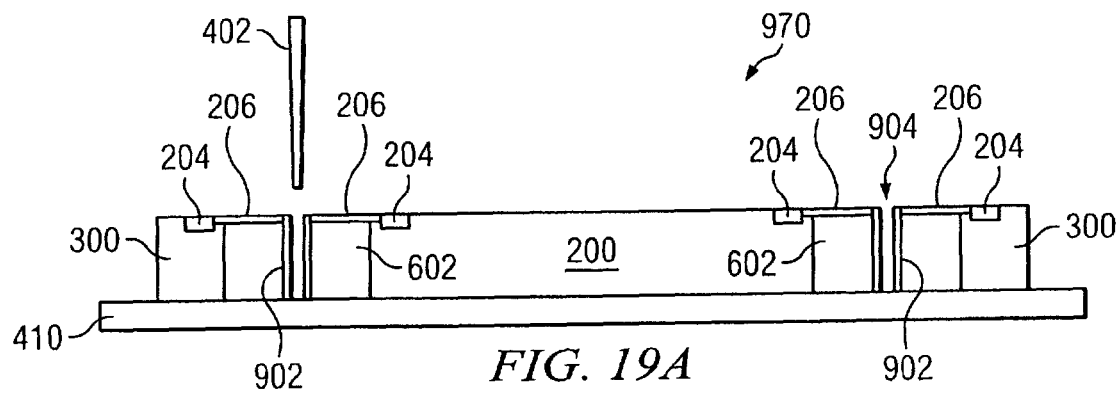
FIGS. 19A and 19B illustrate a tenth step in a second exemplary method of manufacturing the through-hole via stackable semiconductor device shown in FIGS. 2A and 2B as seen in a side and top view, respectively.
Figure 19B:
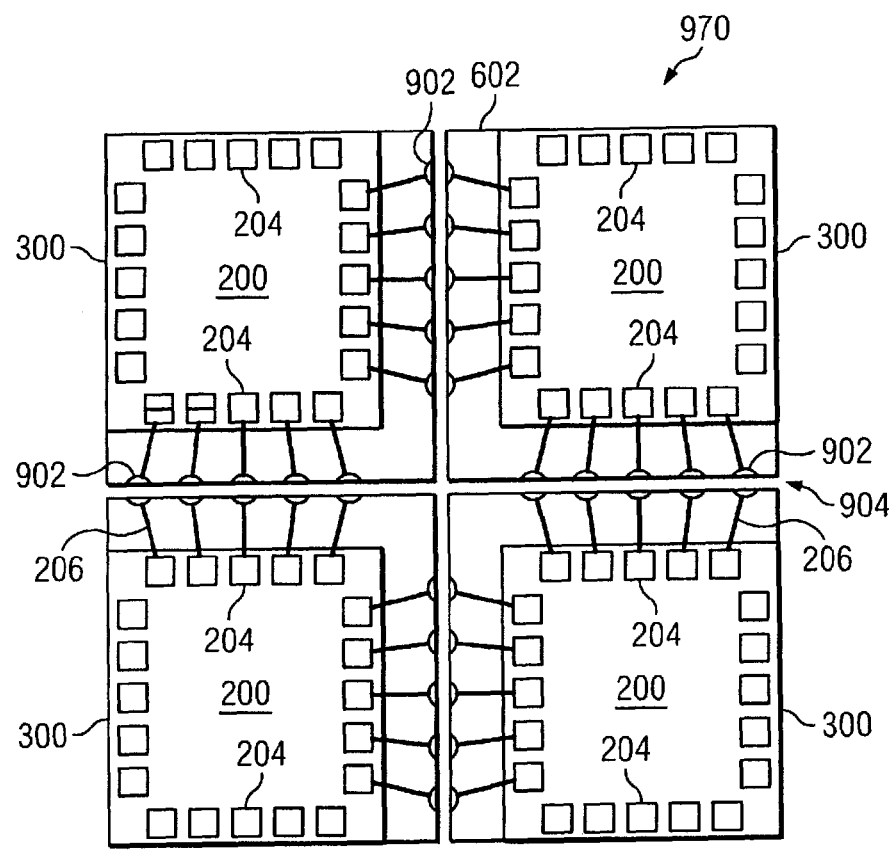

FIGS. 19A and 19B illustrate a tenth step in the second exemplary method of manufacturing the through-hole via stackable semiconductor device shown in FIGS. 2A and 2B. A cutting source 402 is again used to singulate the via hole wafer 960 into the depicted segments 970, resulting in the gaps 904. As a final step, following the second singulation process, a die pick and place machine can be utilized to again remove each device 200 from the dicing tape 410.

Figure 20:
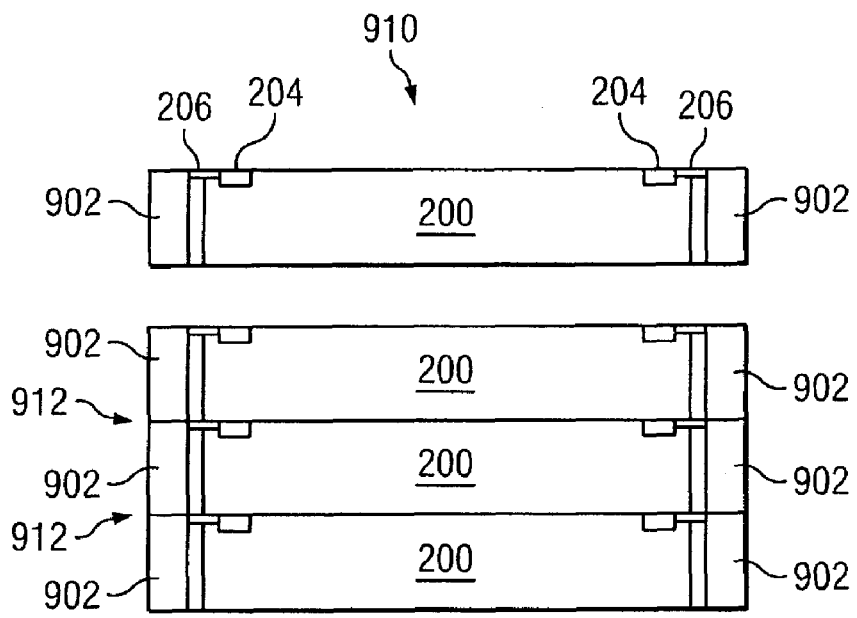
FIG. 20 illustrates a third exemplary embodiment of a through-hole via stackable semiconductor device, shown utilizing a die-to-die stacking configuration in a side view.

FIG. 20 illustrates a third exemplary embodiment of through-hole via stackable semiconductor devices 910, shown utilizing a die-to-die stacking configuration in a side view. A series of devices 200 can be stacked 910 as shown to suit a particular application. Each of the metal vias 902 can be coupled 912 using a direct via metal bonding process. As one skilled in the art would anticipate, any number of devices 200 can be stacked as shown to realize a desired implementation.

Figure 21:
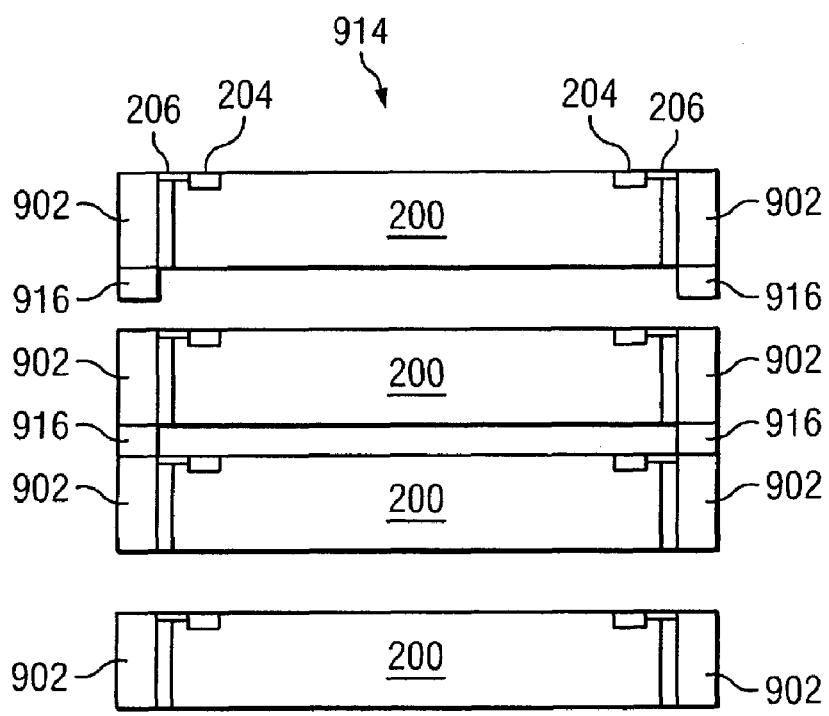
FIG. 21 illustrates a fourth exemplary embodiment of a through-hole via stackable semiconductor device, shown utilizing a die-to-die stacking configuration which incorporates solder paste, again in a side view.

FIG. 21 illustrates a fourth exemplary embodiment of through-hole via stackable semiconductor devices, shown utilizing a die-to-die stacking configuration which incorporates solder paste 916, again in a side view. The solder paste 916 includes a mix of small solder particles and flux. A variety of solder pastes of various materials can be incorporated. The solder paste 916 can be applied using a reflow soldering method to create a strong metallurgical bond between each of the stacked devices 914.

Figure 22:
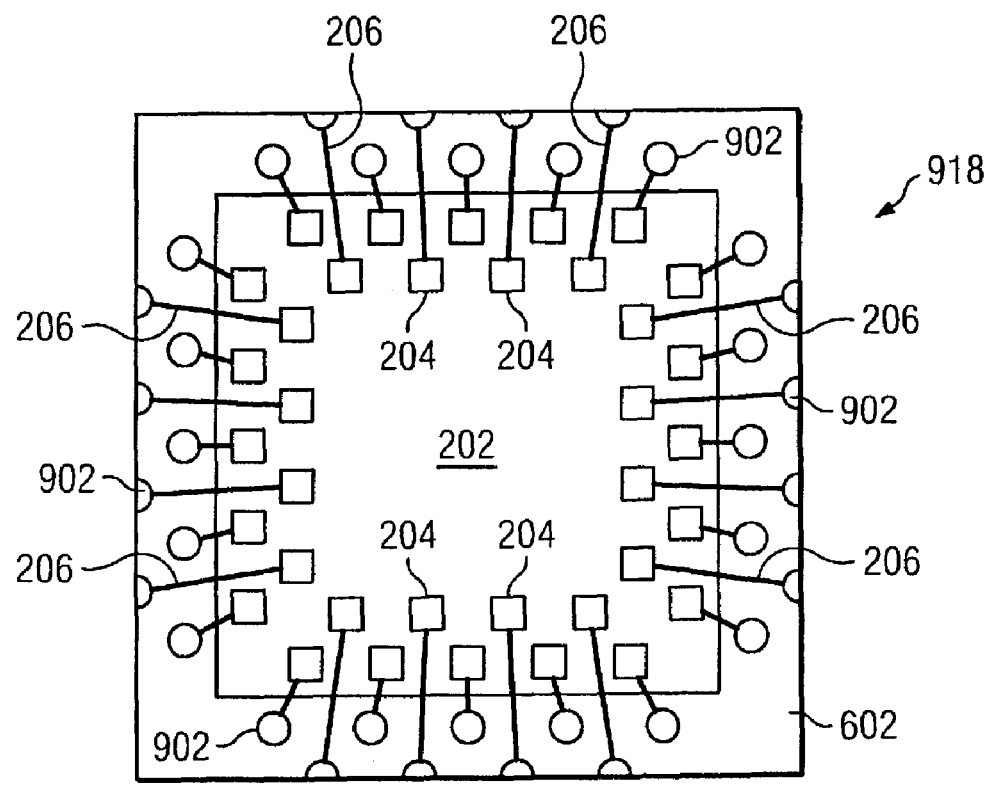
FIG. 22 illustrates a fifth exemplary embodiment of a through-hole via stackable semiconductor device, having multiple rows of bond pads and multiple rows of via holes as shown in a top view.

A fifth exemplary embodiment of a through-hole via stackable semiconductor device 918 is shown in FIG. 22. The present embodiment includes multiple rows of bond pads 204 and multiple rows of via holes 902 as shown in a top view which are appropriately connected with metal tracings 206. Each of the via holes 902 are disposed in the organic material 602 as shown. Any number of configurations of dies 202 having multiple rows of bond pads 204 and multiple rows of via holes 902 can be implemented. In addition to the present embodiment 918, another embodiment can be realized which connects the depicted half-cut outer vias 902 to bond pads 204 which are not located on the active surface of die 202, but on an additional surface, such as an additional die 202 or elsewhere as a specific implementation requires.

Figure 23:
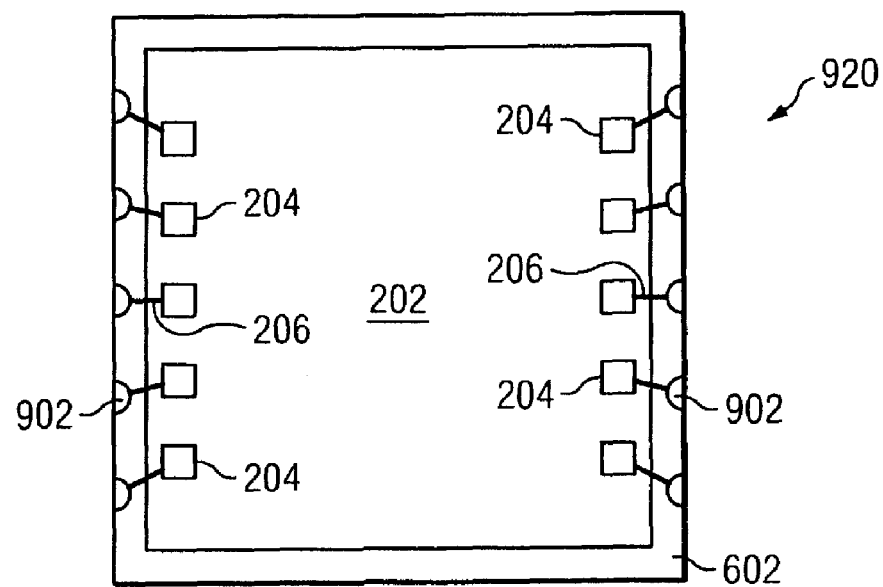
FIG. 23 illustrates a sixth exemplary embodiment of a through-hole via stackable semiconductor device, incorporating a row of half-cut via holes coupled to a row of bond pads on opposing sides of a die as shown in a top view.

A sixth exemplary embodiment of a through-hole via stackable semiconductor device 920 is shown in FIG. 23. Device 920 illustrates an additional configuration of bond pads 204, traces 206, and a series of half-cut vias 902 which are disposed on opposing sides of a die 202. Here again, the dies 902 are formed in the organic material 602 which is disposed on each peripheral side of die 202 as shown. In a variation of the depicted embodiment 920, a configuration can include complete vias 902.

Figure 24:
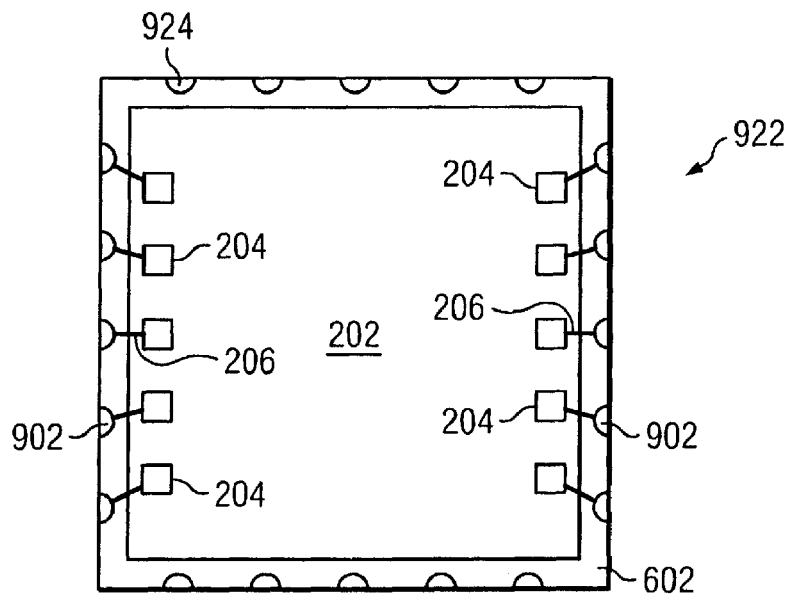
FIG. 24 illustrates a seventh exemplary embodiment of a through-hole via stackable semiconductor device, incorporating dummy via holes on opposing sides as shown in a top view.

A seventh exemplary embodiment of a through-hole via stackable semiconductor device 922 is depicted in FIG. 24. Device 922 includes a series of so-called "dummy" via holes 924 which are disposed on opposing sides of the die 202 as shown. Vias 902 are disposed on the left and right hand side as shown. Dummy via holes 924 can provide for electrical connectivity through the device 922 for specific applications. Dummy via holes 924 can be used to connect an additional device 922 or package using a wire bonding process. In addition, the holes 924 can act as a ground or as a conduit for input/output (I/O) signals.

Figure 25:
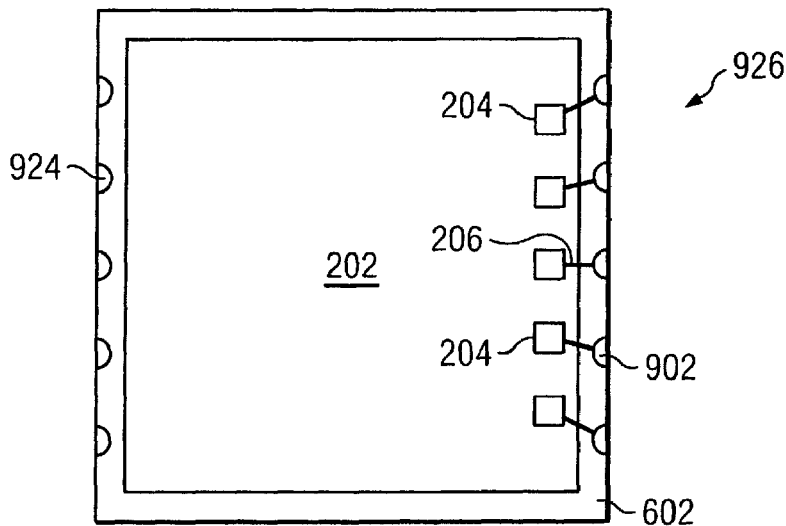
FIG. 25 illustrates an eighth exemplary embodiment of a through-hole via stackable semiconductor device, incorporating dummy via holes on a single side as shown in a top view.

Dummy holes 924 can be configured, as with vias 902, in a variety of implementations. For example, multiple rows, or full or half-cut holes 924 can be implemented. FIG. 25 illustrates one such embodiment of a device 926, which includes a row of halt-cut dummy vias 924 on the left side of die 202, and a row of through-hole vias 902, on the right side of die 202, again disposed in the organic material 602.

Figure 26:
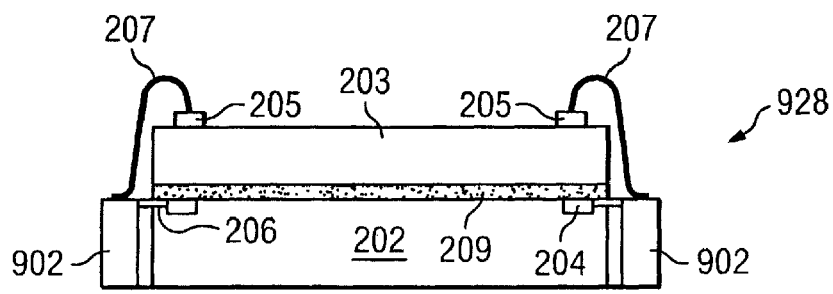
FIG. 26 illustrates a ninth exemplary embodiment of a through-hole via stackable semiconductor device, depicting two stacked dies utilizing the dummy via holes as seen in FIGS. 24 and 25 to connect a top die with a wire-bonding process.

FIG. 26 illustrates a ninth exemplary embodiment of a through-hole via stackable semiconductor device 928, depicting two stacked dies 202 and 203 utilizing the dummy via holes 902 as seen in FIGS. 24 and 25 to connect a top die 203 with a wire-bonding process. A series of bond pads 205 is disposed on an active surface of the die 203. Wire bonds 207 connect the bond pads 204 to the vias 902. A dielectric, insulating or bonding material 209 is disposed between the die 202 and 203 to provide structural support for the device/package 928.

Semiconductor devices, such as device 200 incorporating a series of through-hole vias 208 or 902 can provide a variety of functionality and flexibility in various applications. Use of the organic material 210 allows placement of the vias 208 outside the die 202, which allows for additional circuitry within the die 202 and enhancing the functionality of the device 200. In addition, by using the organic material 210 instead of wafer 300 material, the respective yield per wafer is increased. The organic material can be configured to be as thick as needed to accommodate a variety of vias 208 in any number of applications.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
    a first semiconductor die;
    a plurality of bond pads formed over a surface of the first semiconductor die;
    an organic material disposed around a peripheral region of the first semiconductor die;
    a via formed in the organic material;
    a dummy via disposed in the organic material that is electrically isolated from the bond pads;
    a conductive material deposited in the via to form a conductive via; and
    a metal trace connecting the conductive via to one of the bond pads.

2. The semiconductor device of claim 1, wherein the organic material includes benzocyclobutene, polyimide, or acrylic resin.

3. The semiconductor device of claim 1, further including a second semiconductor die stacked over the first semiconductor die, the second semiconductor die being electrically connected to the first semiconductor die through the conductive via.

4. The semiconductor device of claim 1, wherein the conductive via is cut through during singulation.

5. The semiconductor device of claim 1, further including:
    a plurality of full-conductive vias disposed in the organic material; and a plurality of half-conductive vias disposed in the organic material.

6. A semiconductor device, comprising:
a first semiconductor die;
a bond pad formed over a surface of the first semiconductor die;
an insulating material disposed around a peripheral region of the first semiconductor die;
a conductive via formed in the insulating material; and
a metal trace disposed in contact with the conductive via and in contact with the bond pad.

7. The semiconductor device of claim 6, wherein the insulating material includes benzocyclobutene, polyimide, or acrylic resin.

8. The semiconductor device of claim 6, further including a second semiconductor die stacked over the first semiconductor die, the second semiconductor die being electrically connected to the first semiconductor die through the conductive via.

9. The semiconductor device of claim 6, wherein the conductive via is cut through during singulation.

10. The semiconductor device of claim 6, further including:
a plurality of full-conductive vias disposed in the insulating material; and
a plurality of half-conductive vias disposed in the insulating material.

11. A semiconductor device, comprising:
a plurality of stacked semiconductor die, each semiconductor die including,
(a) a plurality of bond pads formed over a surface of the semiconductor die,
(b) an insulating material disposed around a peripheral region of the semiconductor die,
(c) a plurality of conductive vias formed in the insulating material, and
(d) a metal trace connecting one of the conductive vias to a first one of the bond pads; and
a dummy via disposed in the insulating material electrically isolated from the bond pads.

12. The semiconductor device of claim 11, wherein the insulating material is an organic material.

13. The semiconductor device of claim 11, wherein the insulating material includes benzocyclobutene, polyimide, or acrylic resin.

14. The semiconductor device of claim 11, wherein the conductive vias are cut through during singulation.

15. The semiconductor device of claim 11, wherein the conductive vias are uncut during singulation.

16. The semiconductor device of claim 11, wherein the bond pads are arranged in a plurality of rows.

17. A semiconductor device, comprising:
a first semiconductor die;
a plurality of bond pads formed over a surface of the first semiconductor die;
an insulating material disposed around a peripheral region of the first semiconductor die;
a plurality of conductive vias formed in the insulating material; and
a metal trace connecting one of the conductive vias to a first one of the bond pads, wherein a second one of the bond pads is electrically isolated from the conductive vias.

18. The semiconductor device of claim 17, wherein the insulating material is an organic material.

19. The semiconductor device of claim 17, wherein the insulating material includes benzocyclobutene, polyimide, or acrylic resin.

20. The semiconductor device of claim 17, further including a second semiconductor die stacked over the first semiconductor die, the second semiconductor die being electrically connected to the first semiconductor die through the conductive vias.

21. The semiconductor device of claim 17, wherein the conductive vias are cut through during singulation.

22. The semiconductor device of claim 17, wherein the conductive vias are uncut during singulation.

23. A semiconductor device comprising:
a first semiconductor die having a top surface, a bottom surface, and a plurality of peripheral surfaces;
a bond pad disposed over the top surface of the first semiconductor die;
an insulating material connected to the first semiconductor die and disposed around the peripheral surfaces;
a conductive via disposed in the insulating material; and
a metal trace disposed on the top surface of the semiconductor die, the metal trace contacting the conductive via and the bond pad.

24. The semiconductor device of claim 23, wherein the insulating material comprises an organic material.

25. The semiconductor device of claim 24, wherein the organic material comprises benzocyclobutene (BCB).

26. The semiconductor device of claim 23, further comprising a dummy via disposed in the insulating material that is electrically isolated from the bond pad.

27. A semiconductor device comprising:
a first semiconductor die having a top surface and a bottom surface;
a bond pad disposed over the top surface of the first semiconductor die;
an insulating material connected to the first semiconductor die and surrounding the first semiconductor die;
a conductive via disposed in the insulating material; and
a metal trace disposed on the top surface of the semiconductor die, the metal trace contacting the bond pad.

28. The semiconductor device of claim 27, wherein the metal trace contacts the conductive via.

29. The semiconductor device of claim 27, wherein the insulating material comprises polyimide.

30. The semiconductor device of claim 27, wherein a top surface of the insulating material is substantially coplanar with the top surface of the semiconductor die.

* * * * *